United States Patent [19]
Baliga

[11] 4,132,996
[45] Jan. 2, 1979

[54] ELECTRIC FIELD-CONTROLLED SEMICONDUCTOR DEVICE

[75] Inventor: B. Jayant Baliga, Schenectady, N.Y.

[73] Assignee: General Electric Company, Schenectady, N.Y.

[21] Appl. No.: 740,027

[22] Filed: Nov. 8, 1976

[51] Int. Cl.² .............................................. H01L 29/74
[52] U.S. Cl. ........................................ 357/21; 357/22; 357/35; 357/36; 357/38; 357/57; 357/58
[58] Field of Search ....................... 357/38, 58, 22, 21, 357/57, 35, 36

[56] References Cited

U.S. PATENT DOCUMENTS

| | | | |
|---|---|---|---|
| 3,254,234 | 5/1966 | Sziklai et al. | 357/22 |
| 3,274,461 | 9/1966 | Teszner | 357/22 |
| 3,432,920 | 3/1969 | Rosenzweig | 357/36 |
| 3,535,599 | 10/1970 | Deak | 357/58 |
| 3,544,864 | 12/1970 | Richman | 357/58 |
| 3,571,675 | 3/1971 | Faust | 357/58 |
| 3,686,684 | 8/1972 | Matsushita et al. | 357/58 |
| 3,810,049 | 4/1974 | Krause | 357/58 |
| 3,893,017 | 7/1975 | Williams | 357/36 |

OTHER PUBLICATIONS

R. Zuleeg, "A Silicon Space-Charge-Limited Triode and Analog Transistor," S-S Electronics, vol. 10, 1967, pp. 449-460.
T. Shao et al., "The Physical Mechanism of the Chargistor in Terms of Minority Carrier Exclusion and Injection," IEEE Trans. on Elec. Dev., vol. ED-14 #6, Jun. 1967, pp. 306-313.

*Primary Examiner*—Joseph E. Clawson, Jr.
*Attorney, Agent, or Firm*—Marvin Snyder; Joseph T. Cohen

[57] ABSTRACT

An electric field-controlled thyristor having improved voltage blocking characteristics comprises a semiconductor substrate with a cathode region in one major surface and interdigitated anode and gate regions in the other major surface. The thyristor includes a single high voltage junction which is capable of blocking voltages of either positive or negative polarity by the application of a control voltage, which is a fraction of the blocking voltage, between the anode and gate regions.

18 Claims, 7 Drawing Figures

ELECTRIC FIELD-CONTROLLED SEMICONDUCTOR DEVICE

The present invention relates to semiconductor devices and more particularly to an electric field-controlled semiconductor device in which current flow between two semiconductor regions of the device is controlled by an electric field in the region of current flow.

Electric field-controlled semiconductor devices, such as field-effect transistors, semiconductor-controlled rectifiers, thyristors and charge transfer devices are well known in the art. Depending upon the particular intended use, certain devices have preference over others. For example, in high power applications involving voltages in excess of 500 volts and currents of 10s to hundreds of amperes, silicon-controlled rectifiers and thyristors are generally preferred. However, with the increasing requirements for still higher power-handling devices, the electric field-controlled thyristor has numerous advantages over either the silicon-controlled rectifier or thyristor. For example, field-controlled thyristors exhibit lower forward voltage drops than semiconductor-controlled rectifiers or thyristors. Also, field-controlled thyristors exhibit a gain characteristic which enables current control, both turn-on and turn-off with significantly lower voltages than either of the aforementioned devices. In co-pending applications Ser. No. 636,070, now U.S. Pat. No. 4,037,245 to A. P. Ferro and Ser. No. 697,984, filed June 21, 1976 to D. E. Houston, et al., of common assignee as the instant application, various embodiments of particularly useful electric field-controlled thyristors are described. Basically, these applications describe devices including three junctions formed in a semiconductor base material, such as N-type silicon. The junctions include an anode junction formed adjacent one surface of the device, and a cathode junction including $N^+$-type conductivity regions interdigitated with $P^+$-type grid regions in the other surface of the device. Essentially, these devices operate as a P-I-N diode between the anode and cathode regions until a reverse bias is applied at the grid region. The reverse bias of the grid region produces a depletion layer in the $N^-$-type region and pinches off the current flow between anode and cathode.

Electric field-controlled thyristors of the type described in the aforementioned co-pending applications exhibit a gain characteristic in the forward blocking mode which is a factor G times the applied reverse bias grid voltage. The gain G of the field-controlled thyristor is governed by the geometry of the grid and cathode structure, primarily being dependent upon the relative depth of the grid and cathode regions and the spacing therebetween. These devices also block current flow in the reverse direction by supporting the applied voltage at the anode-substrate junction. Devices of the type described therefore have two junctions that support high voltages; the anode-substrate junction and the grid-substrate junction generally located at opposite surfaces of the wafer.

Since both junctions must support high voltages, these junctions require proper surface termination and passivation. As a result, particular care must be exercised in the wafer processing and in the final stages of device mount-down to headers. Since the degree of care required in the fabrication of such devices is so demanding, there is a substantial yield problem associated with the fabrication of these devices.

Accordingly, it is an object of this invention to provide a new and improved electric field-controlled thyristor structure having a low forward voltage drop during conduction and which is capable of blocking voltages in both forward and reverse directions.

It is another object of this invention to provide an improved electric field-controlled semiconductor device including a single high voltage junction which supports blocking voltages of either bias polarity.

Briefly, in accordance with one preferred embodiment of the present invention, a field-controlled semiconductor device comprises a semiconductor substrate of one type conductivity with a cathode region of the same conductivity formed in one of the major surfaces but of higher conductivity than the substrate and an anode region of opposite type conductivity in the other major surface and within the interstices of a grid region, also of opposite type conductivity, in the same major surface as the anode region. Metallized contacts are formed over the grid region, cathode region and anode region for providing high lateral conductivity and hence high current-carrying capabilities for the device.

The field-controlled device of the present invention includes a single high voltage junction between the grid and substrate which is capable of blocking voltages of either polarity. The magnitude of the blocking voltage capability for either polarity is determined by the breakdown voltage of the grid-substrate junction or G times the breakdown voltage of the grid-anode junction, whichever is lower, where G is a gain function of the device.

Other objects and advantages of the invention, along with a more complete description thereof are provided below in conjunction with the accompanying drawings in which.

Figure 1:
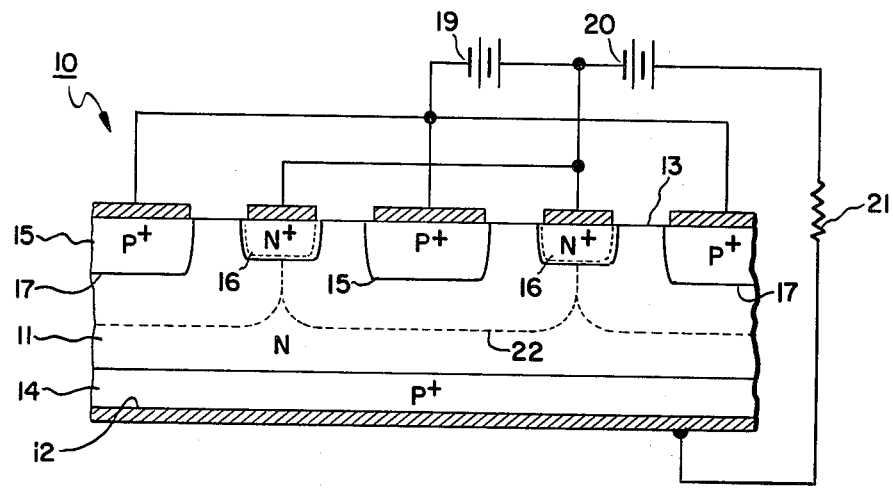
FIG. 1 is a partial sectional view of an electric field-controlled thyristor structure in accordance with the prior art.

FIG. 1 illustrates an electric field-controlled thyristor structure constructed in accordance with the prior art and designated generally by the reference numeral 10. The thyristor structure comprises a semiconductor substrate 11 of one-type conductivity, such as N-type silicon, for example. The substrate 11 includes two opposed major surfaces 12 and 13 with an anode region 14 of $P^+$-type conductivity formed in the surface 12. The surface 13 of the substrate is provided with a gate or grid region 15 of P-type conductivity and comprises an interconnecting grid structure with the spacing between grid members selected in accordance with the desired diode characteristics. Within the interstices defined by the interconnecting grid structure of the gate region 15 are a plurality of interconnecting cathode regions 16 of N+-type conductivity. The higher conductivity of the cathode regions 16 facilitates electrical contact and additionally increases the injection efficiency of majority carriers into the semiconductor substrate.

While only partial sectional views of the field-controlled thyristors are illustrated in FIGS. 1 through 7, it should be understood that these sectional views may be portions of square, rectangular, or circular structures, for example, and that the grid structure may also take similar configurations, as well as a spiral configuration, if desired. Further, it is to be understood that the structures illustrated herein will include appropriate junction terminations to insure satisfactory voltage blocking capabilities. Suitable junction termination techniques include positive beveling, deep diffused boundaries or moats and field or guard rings, by way of example.

As illustrated in FIG. 1, the cathode regions 16 are connected together and to the positive terminal of a voltage source 19, the negative terminal of which is connected to the gate region 15. Another voltage source 20 has its negative terminal connected to the positive terminal of the voltage source 19 and the positive terminal of the voltage source 20 connected through a load impedance 21 to the anode 14.

Operation of the electric field controlled thyristor illustrated in FIG. 1 can be generally characterized as a forward biased diode (in the absence of a gate voltage from the voltage source 19) with current flowing from the voltage source 20 through the load 21 to the anode region 14, through the body of the semiconductor substrate 11 and to the cathode region 16 and then back to the voltage source 20. Current flow in this mode of operation is substantially unimpeded by any electric fields until application of a gate voltage from the source 19 which causes the formation of a depletion region 22 around each gate region 15, at the gate-substrate junction 17. As the magnitude of the depletion region 22 increases, the current flow from anode to cathode decreases until eventually adjacent depletion regions intersect and cause current flow from anode to cathode to be "pinched off". This is the forward blocking mode of the device and the voltage required between the grid and cathode to prevent current flow between anode and cathode is a factor 1/G times the applied forward bias between anode and cathode. Those skilled in the art can readily appreciate that the device illustrated in FIG. 1 also blocks current flow in the reverse voltage direction by supporting the voltage at the anode-substrate junction.

Figure 2:
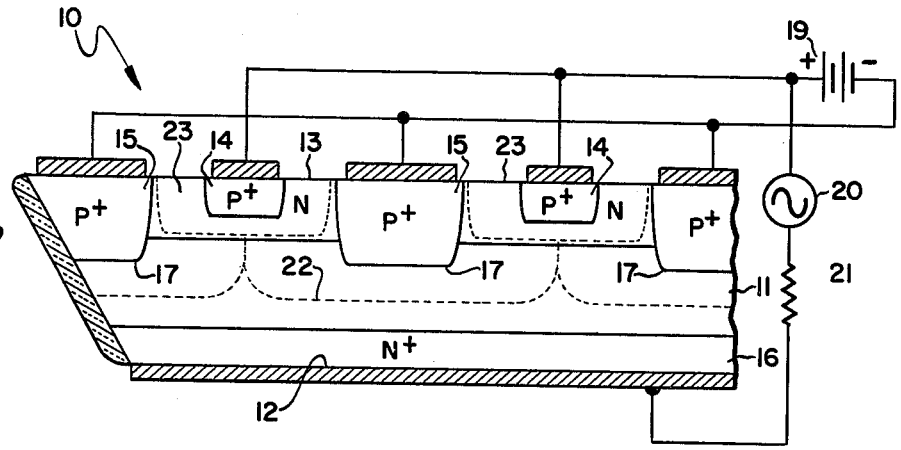
FIG. 2 is a partial sectional view of an embodiment of an electric field-controlled thyristor structure in accordance with a preferred embodiment of the present invention.
Figure 3:
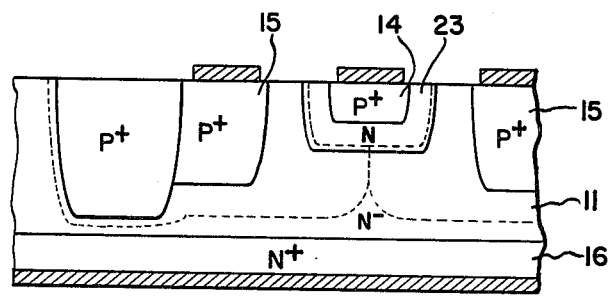
FIGS. 3, 4 and 5 are partial sectional views of alternative embodiments of the electric field-controlled thyristors also in accordance with the present invention.

A field-controlled thyristor constructed in accordance with a preferred embodiment of the present invention is illustrated in FIG. 2. Comparison between the embodiment of the invention illustrated in FIG. 2 and the prior art of FIG. 1 (wherein like reference numerals are used to designate like structural regions) illustrates the primary differences between the structures as the interchanging of the anode and cathode regions 14 and 16 respectively. Additionally, however, the anode regions 14 are surrounded by a region 23 of N-type conductivity which in FIG. 2, for example, is coplanar with the surface 13 and extends to and intersects the adjacent gate region 15. In FIG. 3, the N-type region 23 comprises a diffused pocket region in which the anode region 14 is formed and in FIG. 4, the region 23 comprises diffused regions of N+-type conductivity interposed between the anode and gate regions, 14 and 15 respectively. As will be described more fully below, the diffused regions 23 of FIGS. 2, 3 and 4 prevent punch-through from anode-to-gate upon application of a control voltage from the voltage source 19 connected between the anode and gate regions.

Figure 5:
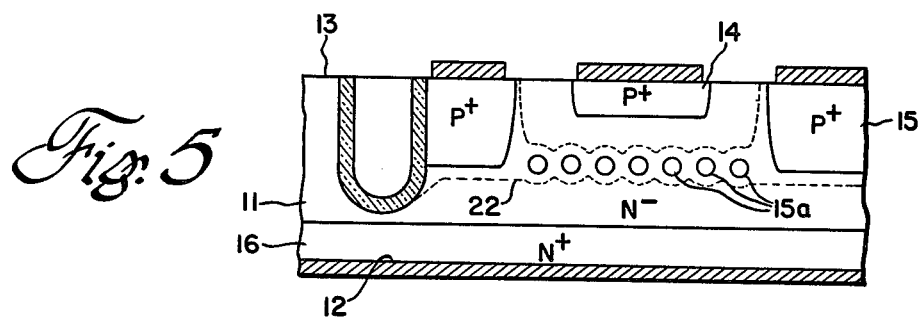

FIG. 5 illustrates yet another embodiment of the invention wherein the grid region 15 includes a plurality of axially aligned buried grid strips 15a, which are formed, for example, by diffusion in the substrate 11 prior to the deposition of an epitaxial layer thereover in which the anode 14 and grid regions 15 are forward. In this embodiment of the invention, the magnitude of the depletion region forming voltage between grid and anode necessary to cause pinch-off is determined primarily by the spacing of the grid strips 15a. Hence, by appropriate spacing of the grid strips 15a, lower pinch-off voltages are possible.

A particularly significant structural and electrical characteristic which results from the interchange of the anode and cathode regions is the elimination of the high voltage anode junction adjacent the surface 12 of the substrate, a major cause of yield problems in the device of FIG. 1. Also, the cathode regions 16 illustrated in FIGS. 2 through 6 merely function as high conductivity contacts to the substrate regions 11 and provide the required electron injection during forward bias operation.

In the forward conduction mode of operation, the electric field-controlled thyristor illustrated in FIG. 2 functions in substantially the same manner as the device illustrated in FIG. 1, i.e., as a P-I-N diode between anode and cathode. Therefore, the device exhibits a low forward voltage drop making it particularly useful in high current applications, i.e., tens to thousands of amperes.

Upon application of a negative bias voltage between the grid 15 and the anode 14 by the voltage source 19, the depletion region 22 is formed around the reverse biased grid-substrate junction 17 which pinches off the current flow between anode region 14 and cathode region 16. In this forward blocking mode, the maximum forward blocking voltage is limited to the lower of either the breakdown voltage of the grid-substrate junction 17 or G times the breakdown voltage between the grid and anode, where G is the gain function of the device which is primarily dependent upon the relative depth of the grid and anode regions and the spacing therebetween. Since the breakdown voltage of the grid-substrate junction 17 is determined by its surface termination, usual positive beveling, deep diffused boundaries, guard rings, deep moats or other surface contours are employed.

Figure 4:
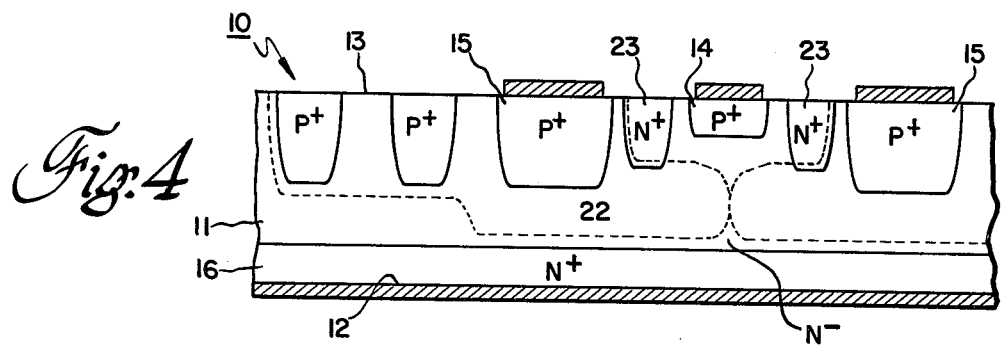

In the reverse bias mode of operation, the anode-cathode voltage is supported at the reverse biased anode-substrate junction, if no voltage is applied at the grid. Since the anode region 14 in the electric field-controlled device illustrated in FIGS. 2, 3 and 4 is a shallow planar diffused junction, for example, it can support only a low voltage, usually less than 100 volts. However, reverse biasing the grid-substrate junction 17, as is done during forward blocking, causes the blocking voltage of the device to be the same as that for the forward blocking mode, i.e., either the breakdown voltage of the grid-substrate junction or G times the breakdown voltage of the grid to anode, whichever is smaller.

The electric field controlled thyristor structure of the present invention, as illustrated in FIGS. 2, 3, 4 and 5, therefore exhibits several desirable characteristics which are particularly useful in high voltage, high current applications. In particular, the electric field-controlled thyristor structures of FIGS. 2, 3, 4 and 5 exhibit a low forward voltage drop during forward conduction, are capable of blocking voltages in both forward and reverse directions and because of the gain characteristic of the devices, even a low breakdown voltage between grid and anode enables the device to block voltages an order of magnitude or more higher than this junction breakdown voltage. Additionally, these devices have only a single junction (grid-substrate) which requires proper surface termination and passivation. However, since this junction lies on the top (surface 13) of the substrate, mounting of the substrate to a header is considerably simplified when compared with the structure of FIG. 1 where special care must be exercised to prevent degradation of the blocking capability of the anode junction. The new structure also allows the application of guard rings to enhance blocking voltage in both bias polarities as illustrated in FIG. 4.

Figure 6:
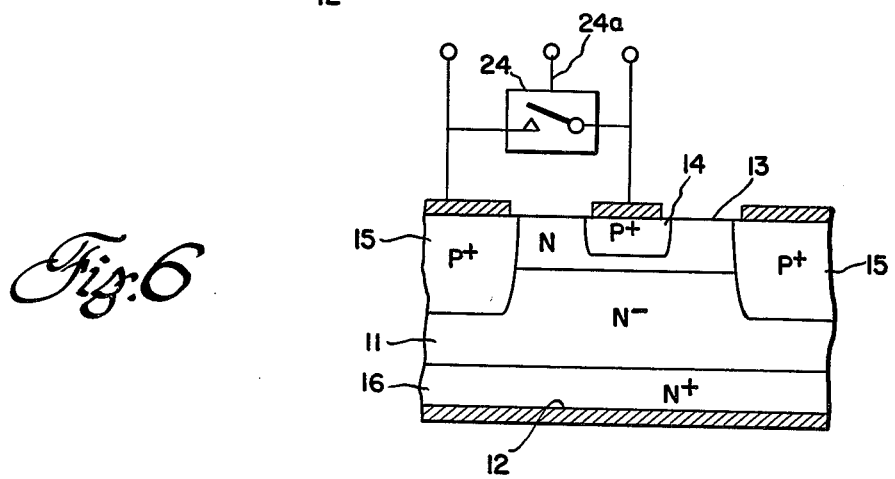
FIG. 6 is a partial sectional view of an embodiment of the present invention wherein the grid is permitted to function as an anode region during forward conduction.

Another particularly desirable characteristic of the invention is illustrated in FIG. 6 wherein the grid regions 15 are permitted to function as part of the anode region 14 during forward conduction. The dual function performed by the grid region 15 permits a much larger portion of the surface area of the device to be used for conducting high currents therethrough. FIG. 6 illustrates a switching device 24 connected between the anode and grid electrodes for electrically short-circuiting these two regions together for selected time periods. Essentially, the switching device 24 provides either a high impedance between the grid and anode during blocking conditions or an electrical short-circuit therebetween during forward conduction. Suitable devices for performing the switching function include electro-magnetic relays, semiconductor controlled rectifiers, bipolar transistors, thyristors or another electric field-controlled thyristor, if desired. The relay is preferable in most applications because of its low voltage drop in the ON state. The electrode 24a is typical of the relay coil or control electrode of any of these devices.

Another desirable characteristic of the invention is illustrated in FIGS. 2-5 is that the minimum allowable width of the $N^-$ region can be made smaller than that necessary in the prior art structure of FIG. 1. In the prior art structure of FIG. 1, to prevent grid-to-anode breakdown via transistor action, the $N^-$ region must have a width of at least the depletion layer at breakdown of the grid-substrate junction plus a diffusion length (typically one-fourth of the depletion layer size). In accordance with the present invention, however, the grid-substrate depletion layer can extend to the $N^+$ cathode (causing punch-through) without loss in blocking voltage, thereby permitting a much narrower $N^-$ region width for the field-controlled thyristors constructed in accordance with the present invention and, therefore, much lower forward-voltage drop in the ON (conducting) state. In other words, the structures illustrated in FIGS. 2 through 5 have a much better trade-off relation between forward voltage drop and blocking voltage than that of FIG. 1.

By way of example, a field-controlled thyristor constructed in accordance with the prior art in a substrate of 60 ohm-cm resistivity and having a breakdown voltage of approximately 600 volts would have a $N^-$ region width of approximately 6 to 7 mils, whereas a field-controlled device having similar characteristics and constructed in accordance with the present invention would have an $N^-$ region width of only approximately 3 mils.

Figure 7:
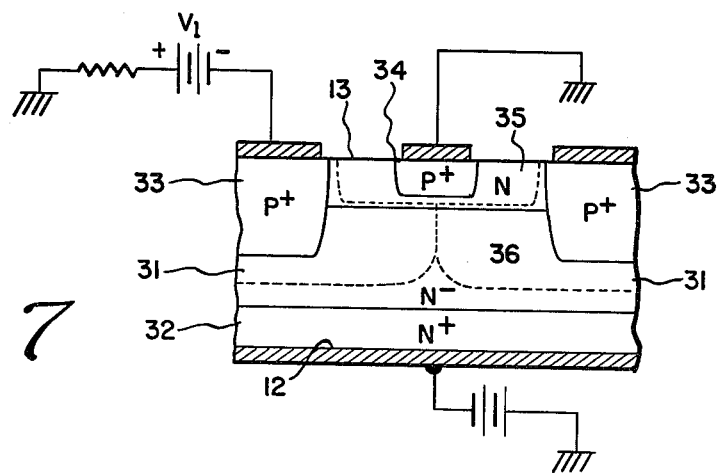
FIG. 7 is a partial sectional view of one embodiment of the invention electrically biased to function as a gate-modulated bipolar transistor.

FIG. 7 illustrates an embodiment of a field-controlled semiconductor device electrically biased to function as a gate modulated bipolar transistor (GAMBIT) which is characterized by a negative resistance characteristic. U.S. Pat. No. 3,979,769 of Houston et al. describes numerous embodiments of such devices and the operation thereof. In accordance with the principles set forth herein with respect to interchanging the anode and cathode regions of an electric field-controlled device, the gate modulated bipolar transistor can also benefit in a similar manner. Accordingly, FIG. 7 illustrates an embodiment of the improved GAMBIT in which a semiconductor substrate of N-type conductivity with two opposed major surfaces is provided with an $N^+$-type region 32 on one surface and functions as the gate electrode of the device. The other surface of the substrate 31 includes a plurality of $P^+$-type regions 33 interdigitated with another plurality of $P^+$-type regions 34. The device also includes a region of N-type conductivity surrounding each $P^+$ region 34 and contacting adjacent regions 33. As illustrated, the $P^+$ regions 33 comprise the collector of the device and the $P^+$ regions 34 comprise the emitter.

Operationally, current flow between the emitter and collector electrodes through a load impedance is controlled by the gate electrode and the bias voltage applied thereto. At low collector voltages, the P-N-P structure comprising regions 33, 34 and 35 functions as a normal lateral transistor. However, as the collector voltage increases, the collector depletion region, depicted by the numeral 36, spreads into the $N^-$ substrate region and pinches off the gate current flowing from the gate electrode to the active "base region" 35 of the transistor. The pinch-off causes a decrease in collector current with increasing collector voltage thereby resulting in a negative resistance between the collector and emitter electrodes.

The negative resistance characteristic of the device illustrated in FIG. 7, like the devices described in the aforementioned patent, is dependent on the gain of the bipolar transistor, the doping level of the $N^-$ substrate, the number of emitter regions and the spacing between collector regions.

The GAMBIT device illustrated in FIG. 7 differs from the devices described in the aforementioned patent in that the FIG. 7 device utilizes a lateral transistor whose gain characteristic is controlled by its base lifetime and the surface recombination velocity at the surface of the region 35. The GAMBIT device described in the aforementioned patent utilizes a wide base transistor in which the base lifetime controls the transistor gain.

So that those skilled in the art can better appreciate the characteristics of a typical field-controlled thyristor, the following example is given by way of illustration and not limitation. Specifically, a device fabricated by planar diffusion technology as illustrated in FIG. 2 may comprise a 60 ohm cm substrate of approximately 10 mils thickness. The gate regions are approximately 50 microns wide and 20 microns deep with the anode regions 10 microns wide and 2 microns deep. The spacing between adjacent gate regions is approximately 20 microns and the thickness of the cathode region is approximately 10 microns.

A device constructed in the manner described above is capable of blocking voltages to approximately 600 volts in both the forward and reverse directions. The gain G of the device is approximately 10 and hence the voltage required by the gate region to block voltages on the order of 600 volts is only 60 volts.

Those skilled in the art can readily appreciate that the electric field-controlled thyristor described in accordance with the present invention is particularly useful in high current and high voltage applications extending beyond the capability of many present semiconductor devices. Additionally, devices constructed in accordance with the present invention employ only a single high voltage junction and have lower forward voltage drops in the ON-conducting state, thereby providing substantially improved performance over prior art devices.

It will be apparent to those skilled in the art that various modifications and changes may be made within the spirit and scope of the invention as described. For example, complementary type devices may also be constructed in accordance with the present invention. Accordingly, the appended claims are intended to cover all such modifications and variations.

What is claimed is:

1. An electric field-controlled thyristor comprising:
    a semiconductor substrate of one type conductivity and having opposed major surfaces;
    a cathode region of said one type conductivity in one of said major surfaces and of higher conductivity than the adjoining portion of said substrate;
    a plurality of interconnecting grid regions of opposite type conductivity in the other major surface; and
    an anode region of opposite type conductivity in said other major surface and within the interstices of adjacent grid regions.

2. The electric field-controlled thyristor of claim 1 further comprising means for controlling the current flow between said anode and cathode regions.

3. The electric field-controlled thyristor of claim 2 wherein said means include electrodes contacting said anode, cathode and grid regions.

4. The electric field-controlled thyristor of claim 3 further comprising voltage source means operatively connected to said electrodes.

5. The electric field-controlled thyristor of claim 4 wherein said voltage source means comprises a first voltage source electrically connected to said grid electrode and said anode electrode.

6. The electric field-controlled thyristor of claim 5 further comprising a load and a second voltage source, said load connected in electrical series relation with said second voltage source and said anode and cathode electrodes.

7. The electric field-controlled thyristor of claim 1 further comprising means for applying a bias voltage between said grid and anode regions for pinching off current flow between said anode and cathode regions.

8. The electric field-controlled thyristor of claim 1 further comprising:
    first voltage source means for applying a bias voltage to said grid and anode regions;
    a load impedance; and
    second voltage source means, said load connected in electrical series relation with said second voltage source and said anode and cathode electrodes.

9. The electric field-controlled thyristor of claim 1 further comprising:
    means for electrically short-circuiting said anode and grid regions for selected time periods.

10. The electric field-controlled thyristor of claim 1 wherein said cathode region is substantially co-planar with said one surface of said substrate and said grid regions is of a greater depth in said substrate than said anode region.

11. The electric field-controlled thyristor of claim 1 wherein said anode region is formed in a pocket region of said one conductivity type but of higher conductivity than said substrate.

12. The electric field-controlled thyristor of claim 1 wherein said anode region is surrounded by a region of said one conductivity type but higher conductivity than said substrate.

13. The electric field-controlled thyristor of claim 1 further comprising a plurality of anode regions in said substrate electrically connected together and a plurality of buried grid regions in said substrate electrically connected together.

14. The electric field-controlled thyristor of claim 5 further comprising termination means for the junction between said grid regions and said substrate.

15. The electric field controlled thyristor of claim 1 further comprising a plurality of anode regions in the other major surface, each of said anode regions located within the interstices of adjacent grid regions.

16. The electric field controlled thyristor of claim 15 further comprising means for applying a voltage source between said anode and cathode regions, said thyristor characterized by a voltage blocking capability in forward and reverse directions, the magnitude of said voltage blocking capability limited by the larger of the breakdown voltage of the semiconductor junction formed between said grid region and said substrate and G times the breakdown voltage between the grid and anode regions, where G is the gain function of said thyristor.

17. The electric field controlled thyristor of claim 16 further comprising termination means for said grid-substrate junction.

18. The electric field controlled thyristor of claim 16 further comprising a region of one conductivity type of higher conductivity than said substrate surrounding said anode regions.

* * * * *